(12) United States Patent
Wang et al.

(10) Patent No.: US 6,297,576 B1
(45) Date of Patent: Oct. 2, 2001

(54) PIEZOELECTRIC ACTUATOR

(75) Inventors: Tak K. Wang, Havertown; Clayton E. Law, Malvern, both of PA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/599,928

(22) Filed: Jun. 22, 2000

(51) Int. Cl.$^7$ ........................................... H01L 41/08
(52) U.S. Cl. ........................................... 310/328; 310/369
(58) Field of Search ............................ 310/328, 366, 310/369

(56) References Cited

U.S. PATENT DOCUMENTS

| | | | |
|---|---|---|---|
| 4,510,412 | * 4/1985 | Suda et al. | 310/328 |
| 4,765,140 | * 8/1988 | Imoto et al. | 310/328 X |
| 5,214,342 | * 5/1993 | Yang | 310/328 |
| 5,332,942 | * 7/1994 | Rennex | 310/328 |
| 6,025,671 | * 2/2000 | Boecking | 310/369 |
| 6,140,742 | * 10/2000 | Kahn | 310/328 |

* cited by examiner

*Primary Examiner*—Mark O. Budd

(57) ABSTRACT

An actuator assembly having a first and a second stack of piezoelectric materials having electrode layers connecting the stacks to a voltage source. A cavity is defined within said first stack and is adapted to receive a first end of the second stack. A first opening and a second opening are defined within the stack wherein each is in fluid communication with the cavity and wherein the first opening has a flat surface within the cavity. A flat face opposite the first opening forms a contact seal with the flat surface. The first and second stacks are adapted to unseal the face from the surface in response to a voltage.

27 Claims, 12 Drawing Sheets

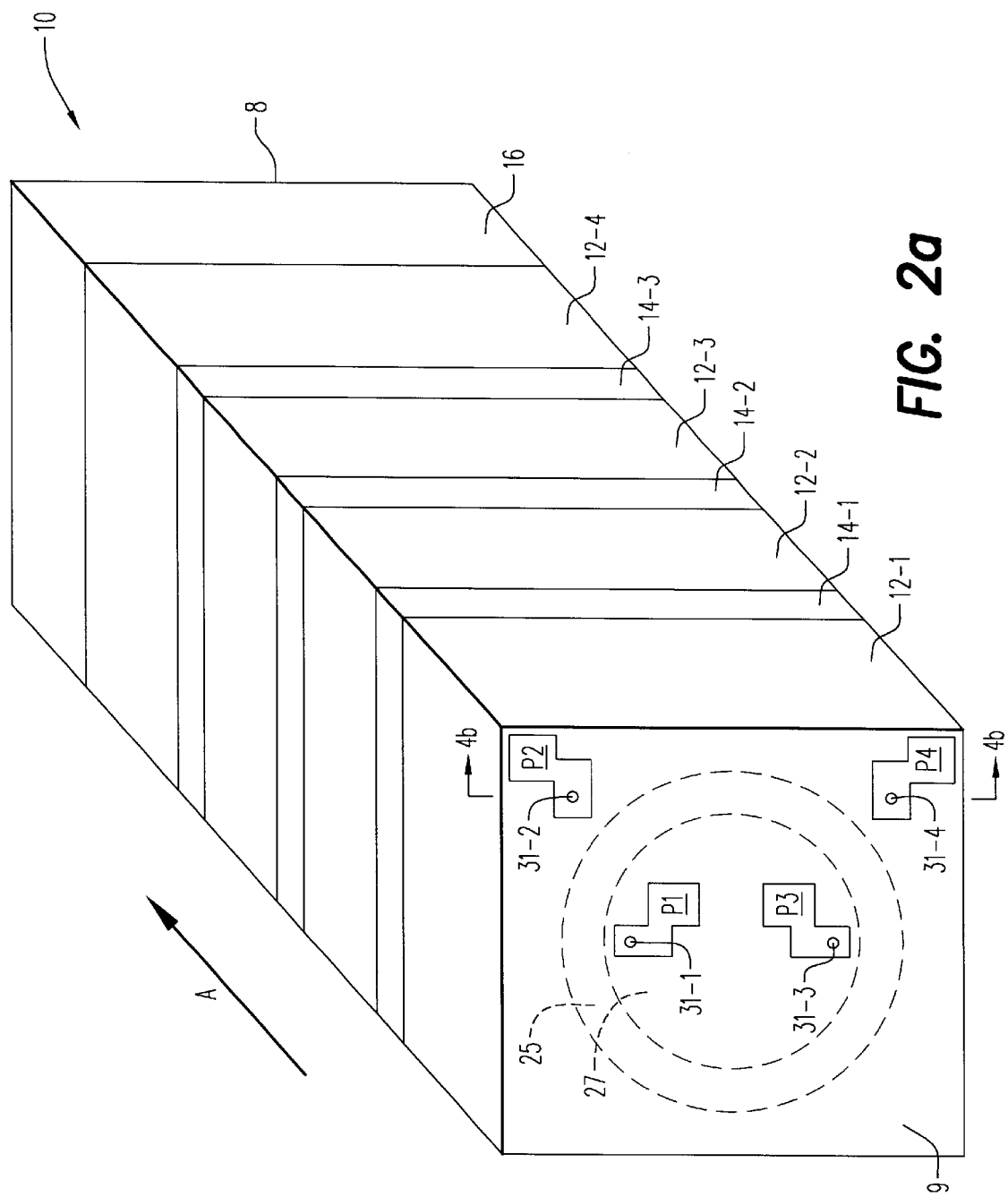

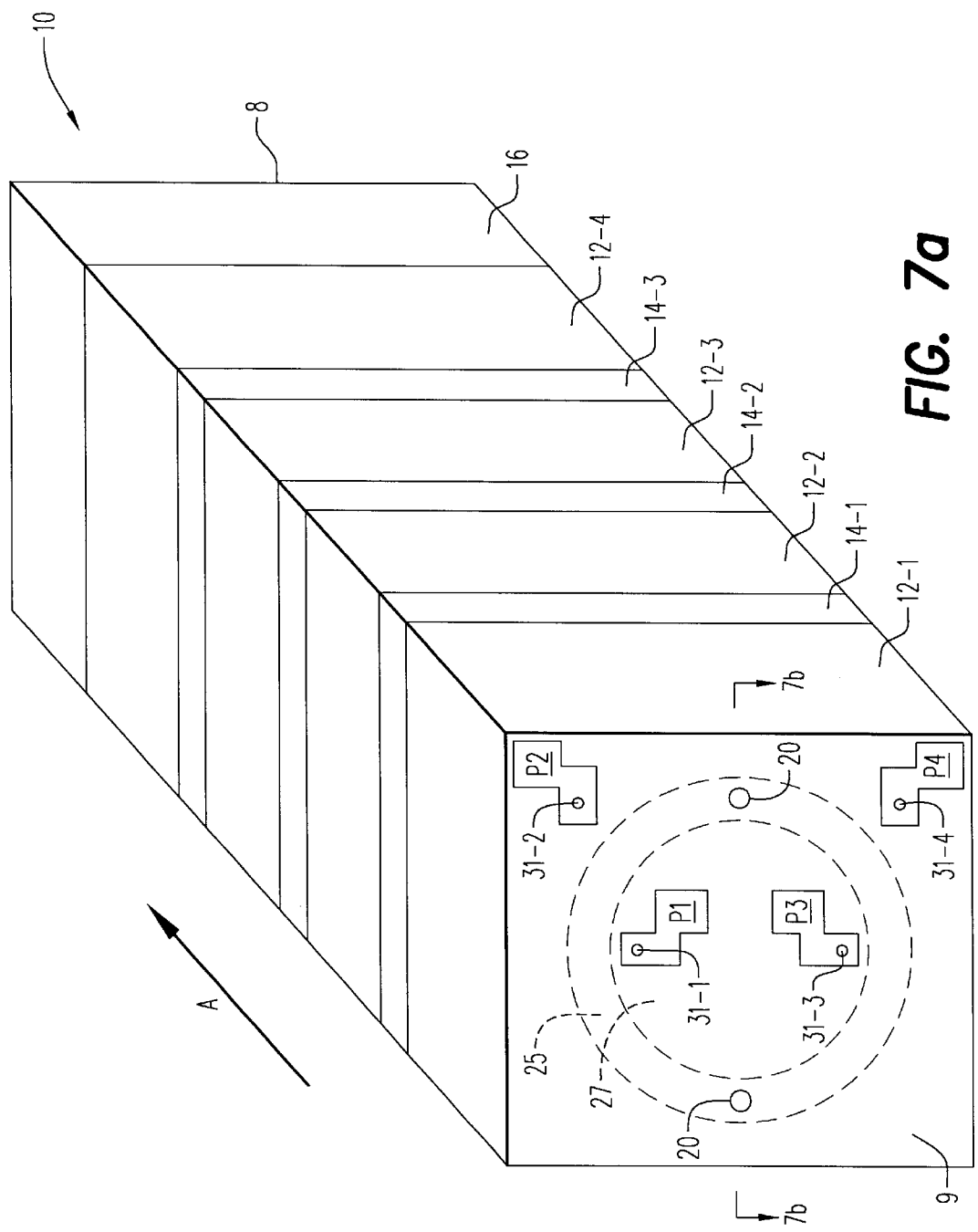

PIEZOELECTRIC ACTUATOR

FIELD OF THE INVENTION

This invention relates to an apparatus and method to precisely control the relative position of two surfaces. More particularly, this invention relates to piezoelectric or magnetostrictive actuators.

BACKGROUND OF THE INVENTION

Piezoelectric materials and magnetostrictive materials (collectively referred to below as "piezoelectric materials") deform when an electric field or magnetic field is applied. Thus, piezoelectric materials, when used as an actuator, are capable of controlling the relative position of two surfaces.

One of the most used piezoelectric materials is quartz. Other piezoelectric materials include certain ceramic materials and certain polymer materials. Since they are capable of controlling the relative position of two surfaces, piezoelectric materials have been used in the past as valve actuators and positional controls for microscopes. Piezoelectric materials, especially those of the ceramic type, are capable of generating a large amount of force. However, they are only capable of generating a small displacement when a large voltage is applied. In the case of piezoelectric ceramics, this displacement can be a maximum of 0.1% of the length of the material. Thus, piezoelectric materials have been used as valve actuators and positional controls for applications requiring small displacements.

Two methods of generating more displacement per unit of applied voltage include bimorph assemblies and stack assemblies. Bimorph assemblies have two piezoelectric ceramic materials bonded together and constrained by a rim at their edges, such that when a voltage is applied, one of the piezoelectric materials shrinks and the other piezoelectric material expands. The resulting stress causes the materials to form a dome. The displacement at the center of the dome is larger than the shrinkage or expansion of the individual materials. However, constraining the rim of the bimorph assembly decreases the amount of available displacement. Moreover, the force generated by a bimorph assembly is significantly lower than the force that is generated by the shrinkage or expansion of the individual materials.

Stack assemblies contain multiple layers of piezoelectric materials interlaced with electrodes that are connected together. A voltage across the electrodes causes the stack to expand or contract. The displacement of the stack is equal to the sum of the displacements of the individual materials. Thus, to achieve reasonable displacement distances, a very high voltage or many layers are required. However, convention stack actuators lose positional control due to the thermal expansion of the piezoelectric material and the material(s) on which the stack is mounted.

Due to the high strength, or stiffness, of piezoelectric material, it is capable of opening and closing against high forces, such as the force generated by a high pressure acting on a large surface area. Thus, the high strength of the piezoelectric material allows for the use of a large valve opening, which reduces the displacement or actuation necessary to open or close the valve.

The typical actuation distance requirement for liquid and gas (collectively referred to below as "fluid") valves is small, generally less than 5 um. However, most are sealed by the compression of an elastomeric seal. In practice, it is the formation of a seal caused by the required compression of the elastomeric seal that consumes a large portion of the 5 um actuation distance.

SUMMARY OF THE INVENTION

The present invention is directed to an piezoelectric actuator assembly. Moreover, the present invention is directed to one and two dimensional arrays of piezoelectric actuator assemblies.

It has been determined by the inventors that a good seal can be formed by forcing two clean flat surfaces together. It is, therefore, not necessary to have an elastomeric seal as long as the two mating surfaces are clean and flat, and as long as the force is sufficient to maintain the surfaces in contact with one another.

Thus, the present invention utilizes the high force generated by piezoelectric materials to provide a force sufficient to precisely control the relative position of two flat surfaces with respect to one another. Moreover, the present invention overcomes the minimal actuation distance available from piezoelectric materials by not requiring elastomeric seals and by effectively doubling the actuation distance available from piezoelectric materials by means of a unique structure.

The actuator assembly in accordance with the teachings herein has a first and a second stack of piezoelectric materials with electrode layers connecting the stacks to a voltage source. A cavity is defined within said first stack and is adapted to receive a first end of the second stack. A first opening and a second opening are defined within the stack wherein each is in fluid communication with the cavity and wherein the first opening has a flat surface within the cavity. A flat face opposite the first opening forms a contact seal with the flat surface. The contact seal of the present invention is formed by forcing together two clean flat surfaces to create a barrier to fluid flow. The first and second stacks are adapted to unseal the face from the surface in response to a voltage.

BRIEF DESCRIPTION OF THE DRAWINGS

FIG. 2a is a top perspective view of the piezoelectric actuator of the present invention;

FIG. 2b is a top view of the layers of FIG. 2a;

FIG. 7a is a top perspective view of an alternate embodiment of the piezoelectric actuator of the present invention;

FIG. 7b is a cross sectional view of the actuator of FIG. 7a;

DETAILED DESCRIPTION OF THE INVENTION

Figure 1:
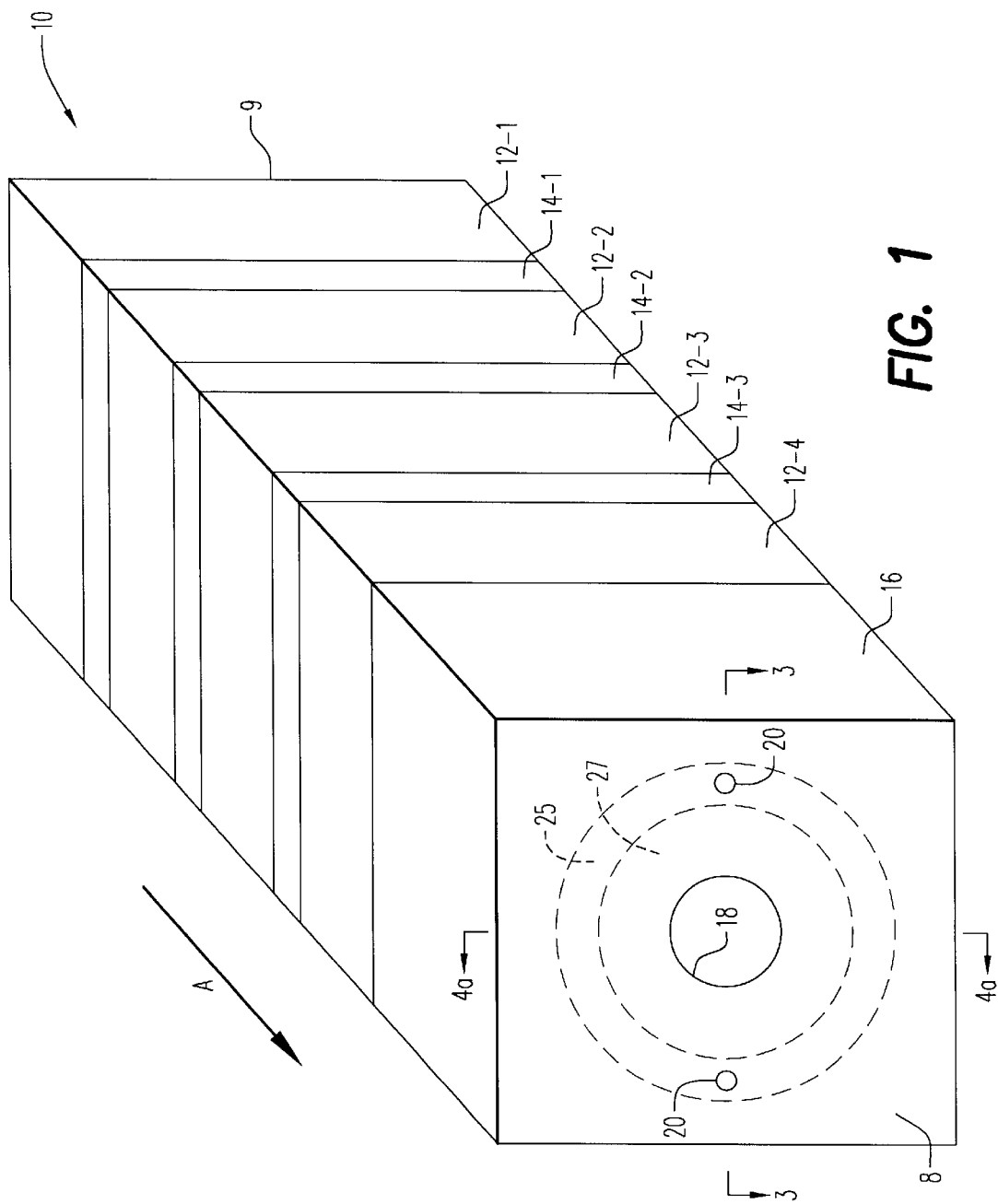
FIG. 1 is a bottom perspective view of the piezoelectric actuator of the present invention.
Figure 2B:
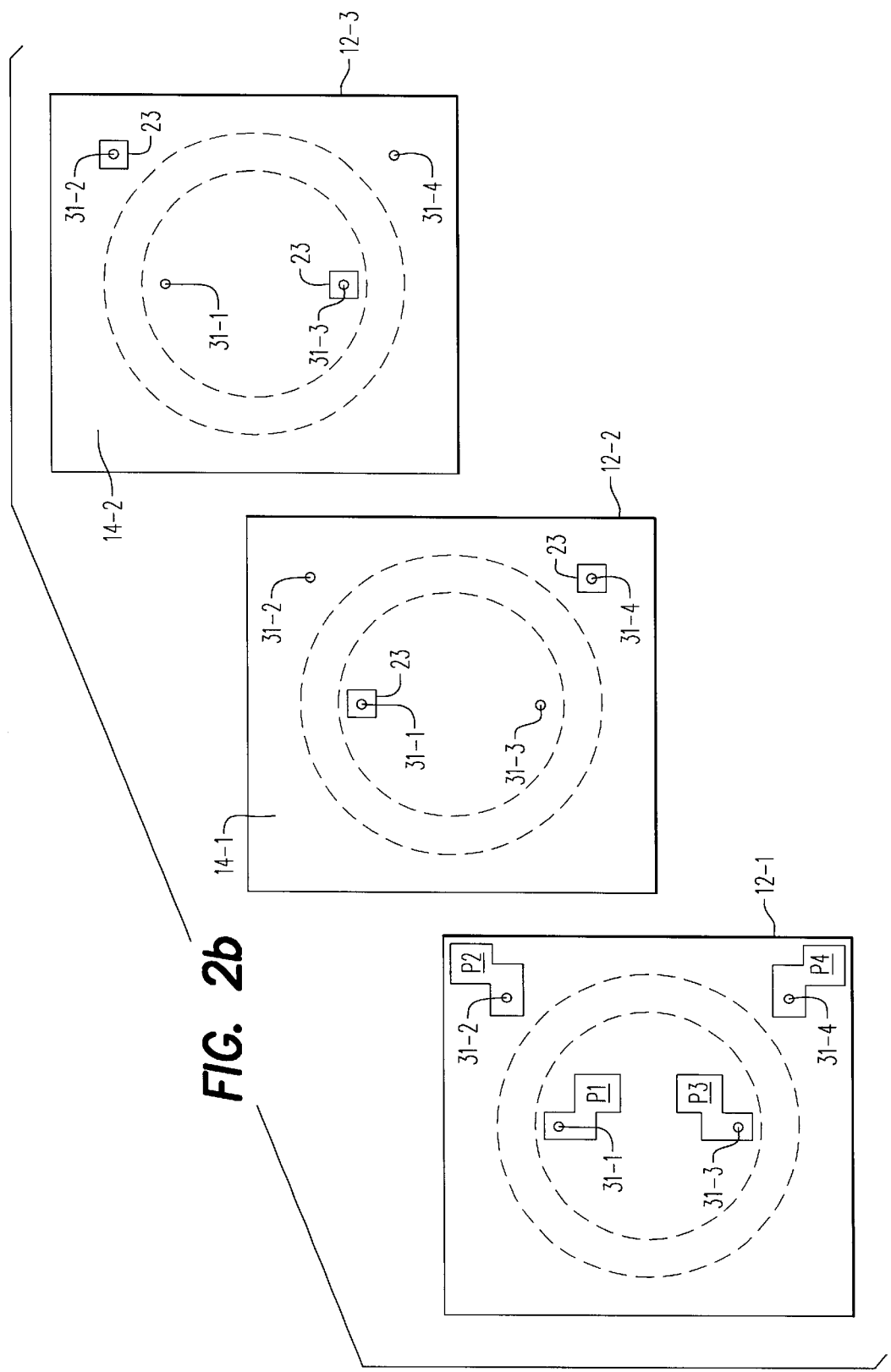

The piezoelectric actuator 10, shown in FIGS. 1, 2a and 2b, includes a stack of multiple layers 12 of individual piezoelectric materials interlaced with electrode layers 14 and an opening layer 16. Bottom 8 of actuator 10 further includes an opening layer 16. Opening layer 16 includes a plurality of openings preferably a first opening 18 and a second opening 20.

Actuator 10 is shown having a total of four layers 12 (12-1, 12-2, 12-3, and 12-4) and three electrode layers 14 (14-1, 14-2 and 14-3), which should be considered for demonstration purposes only, as more than four layers 12 and corresponding electrode layers 14 are preferably used. In a preferred embodiment, actuator 10 includes a sufficient number of layers to provide at least about 3 um of actuation. Moreover, in a more preferred embodiment, actuator 10 provides about 20 um of actuation.

Figure 3:
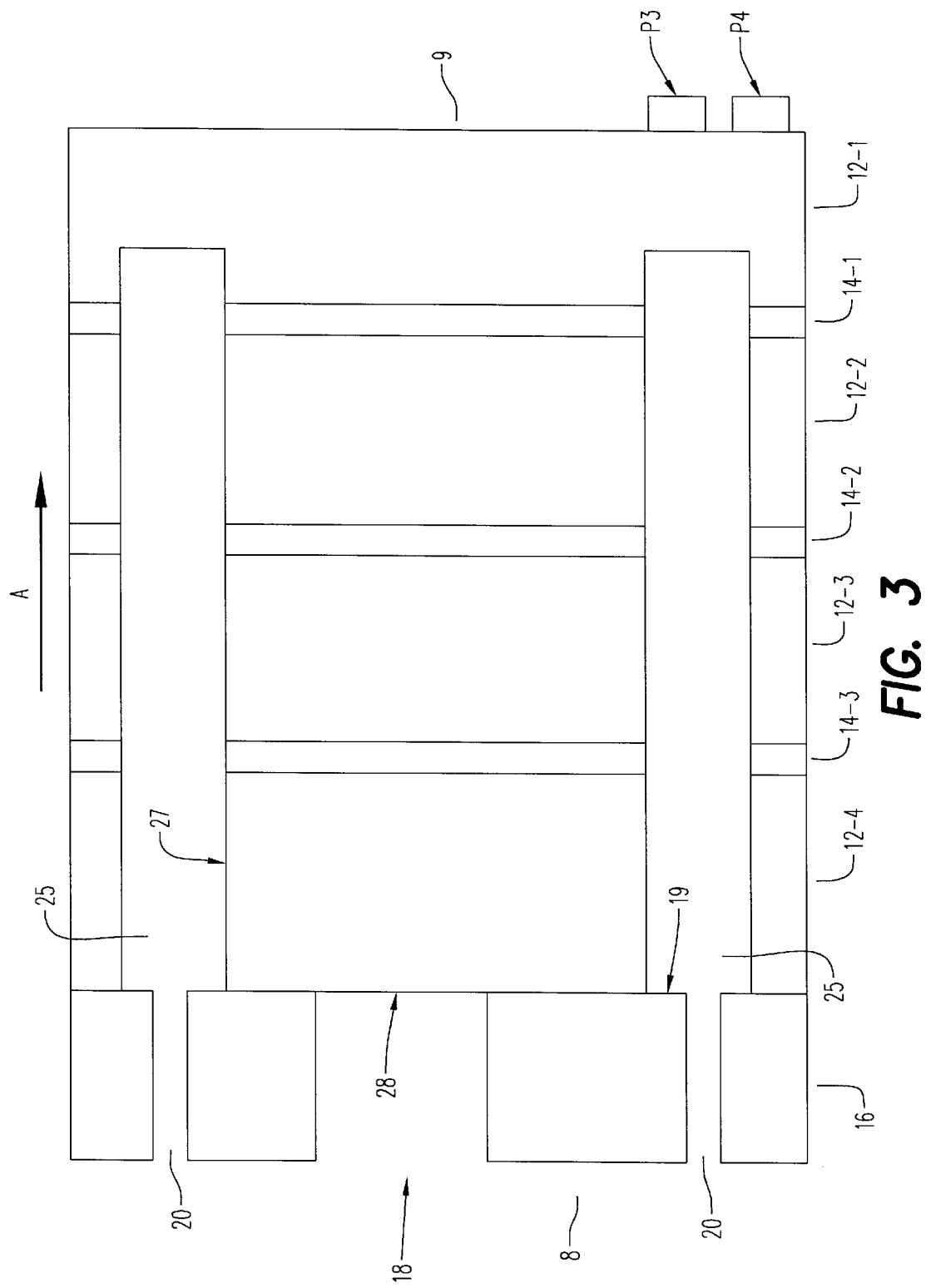
FIG. 3 is a first cross sectional view of the actuator of FIG. 1.
Figure 4A:
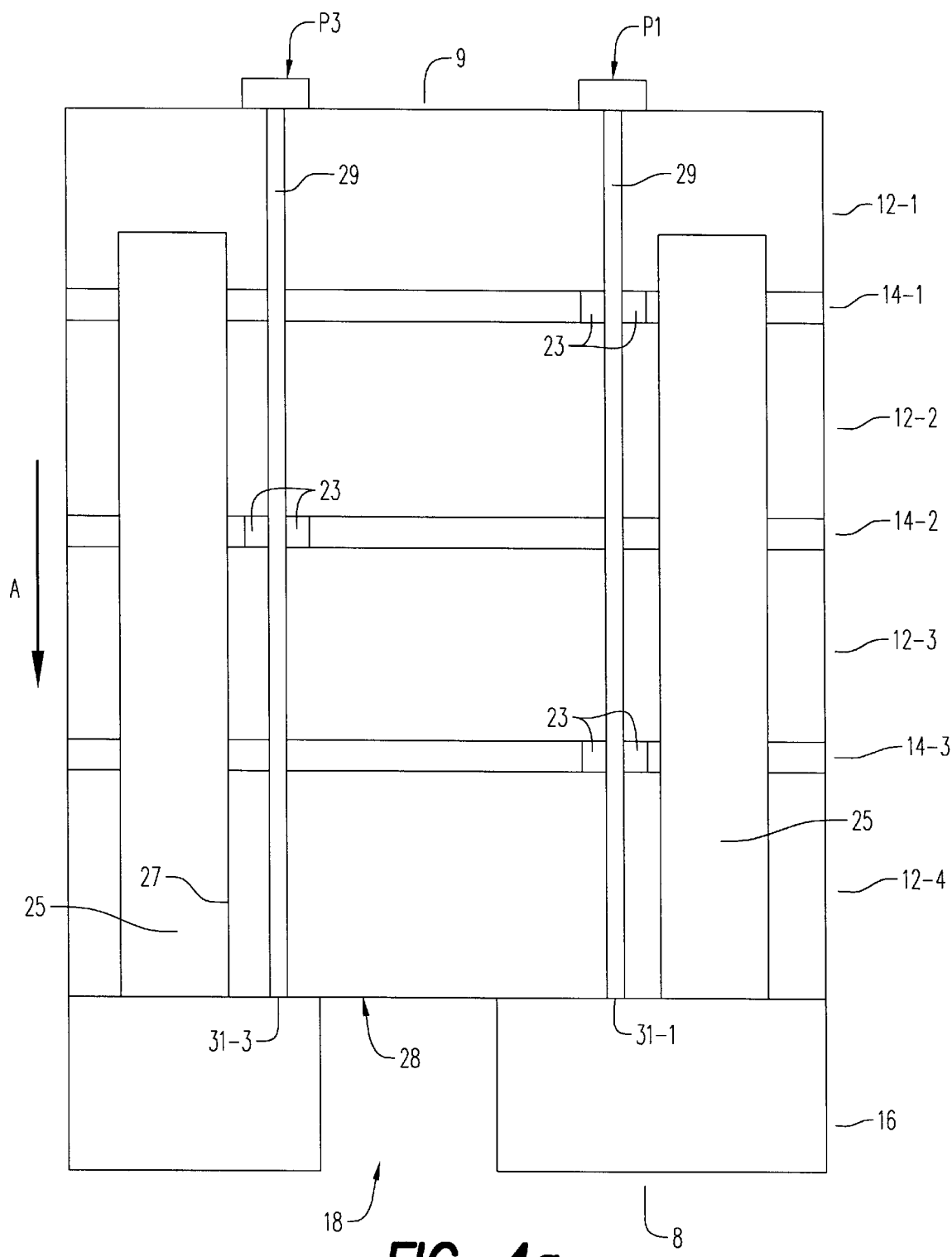
FIG. 4a is a second cross sectional view of the actuator of FIG. 1.
Figure 4B:
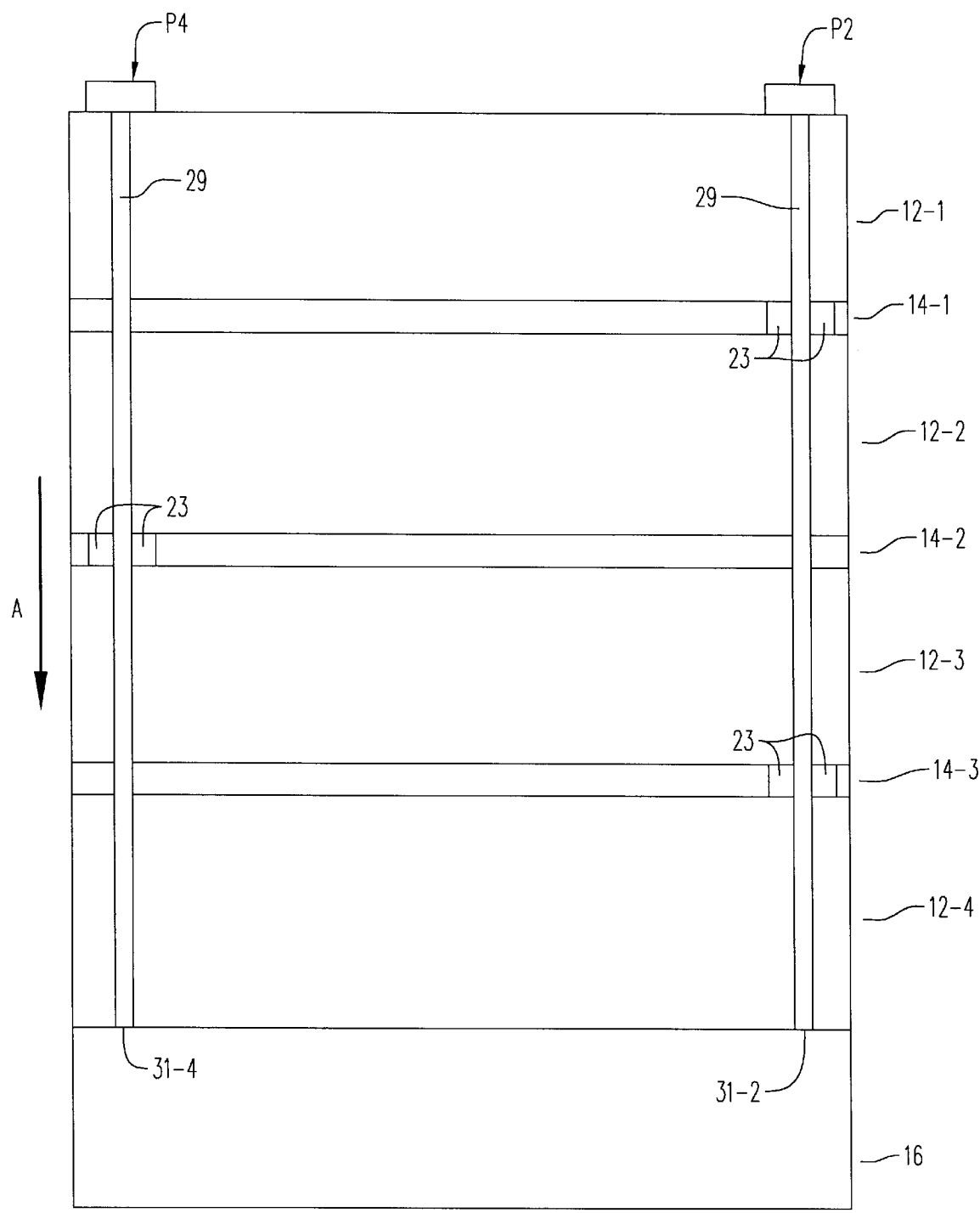
FIG. 4b is a third cross sectional view of the piezoelectric actuator of FIG. 1.

Actuator 10 has an annular cavity 25 defined therein, shown in FIGS. 3, 4a and 4b. A cylindrical core 27 is formed within cavity 25 opposite to opening layer 16. Core 27 has a diameter larger than the diameter of first opening 18. Similar to actuator 10, core 27 contains a second stack of multiple layers 12 of individual piezoelectric materials. Cavity 25 is formed within actuator 10 by means of machining, ultrasonic milling, laser cutting or other suitable means. Additionally, portions of cavity 25 can be partially punched into the uncured piezoelectric materials and the remaining material removed by machining, ultrasonic milling, laser cutting or other suitable means.

First opening 18 defined within opening layer 16 has a diameter of about 75 um. Cavity 25 has an outside diameter of diameter of about 4 mm and an inside diameter forming core 27 of about 3 mm. Second opening 20 has a diameter of at least 75 um, preferably about 150 um. While first opening 18, core 27, cavity 25 and second opening 20 are described as having a "diameter", one skilled in the art would recognize that other cross sections may be utilized, such as ovals, squares, rectangles and the like.

Opening layer 16 is made of a material which has thermal expansion properties similar to layers 12. One suitable material for opening layer 16 is silicon. In an alternate embodiment, opening layer 16 is also made of piezoelectric materials. First opening 18 and second opening 20 are formed within layer 16, if made of silicon, by means of chemical etching, ultrasonic milling, laser cutting and other suitable means. First opening 18 and second opening 20 are formed within layer 16, if made of piezoelectric materials, by means of machining, ultrasonic milling, laser cutting or other suitable means. Additionally, portions of first opening 18 and second opening 20 can be partially punched into the uncured piezoelectric materials and the remaining material removed by machining, ultrasonic milling, laser cutting or other suitable means.

The electrical connection of electrode layers 14 is shown in FIGS. 2a, 2b, 4a and 4b. Each layer 12 has matching holes 31 formed therein. Holes 31 are formed by machining, ultrasonic milling, laser cutting, partially punching and partially machining, or other suitable means. Electrode layer 14 is formed from an electrically conductive material, such as a layer of electrically conductive ink which is printed upon the top of each layer 12, with the exception of top layer 12-1 which has no need of electrode layer 14. Other suitable electrically conductive materials can be used, such as evaporated metal layers.

Top layer 12-1 has electrically conductive pads P1, P2, P3, P4 disposed on its top surface 9. Shown in FIG. 2b, electrode layer 14-1 is disposed upon layer 12-2 except in areas 23 defined about holes 31-4 and 31-1. In an alternate embodiment, a vacuum is applied to draw the electrode layer 14-1 in to holes 31-3 and 31-2. Electrode layer 14-2 is printed upon layer 12-3 except in areas 23 defined about holes 31-3 and 31-2. In an alternate embodiment, a vacuum is applied to draw the electrode layer 14-2 in to holes 31-1 and 31-4. This pattern of alternating areas 23 between holes 31-4/31-1 and 31-3/31-2 on successive layers 12 enables the electrical connection of every other layer 12 by filling holes 31 with electrical conductor 29 after stacking layers 12 with electrode layers 14 disposed thereon. For example, conductor 29 within holes 31-1, 31-2 forms an electrical connection with electrode layer 14-2, but does not form an electrical connection with electrode layers 14-1, 14-3, due to areas 23. Moreover, conductor 29 within holes 31-3, 31-4 forms an electrical connection with electrode layers 14-1 and 14-3, but does not form an electrical connection with electrode layer 14-2, due to areas 23.

Pads P1 and P2 are electrically connected together and pads P3 and P4 are electrically connected together. A voltage applied to P1/P2 and to P3/P4 causes actuator 10 to expand in a direction shown by arrow A, and causes core 27 to contract in a direction opposite to arrow A. The voltage that is applied to electrode layers 14 generates an electric field across layers 12 of actuator 10 causing layers 12 to expand in the direction shown by arrow A, and core 27 to contract in the direction opposite to arrow A. Thus, the total displacement of the expansion of actuator 10 and contraction of core 27 is equal to twice the sum of the displacement provided by individual layers 12. Conversely, removal of the voltage applied to electrodes 14 causes actuator 10 to contract in a direction opposite to the direction shown by arrow A and core 27 to expand in the direction shown by arrow A.

In yet another embodiment, either pads P1 and P2 are electrically connected together or pads P3 and P4 are electrically connected together. In this embodiment, voltage applied to P1/P2 causes actuator 10 to expand in a direction shown by arrow A, and voltage applied to P1/P2 causes core 27 to contract in a direction opposite to arrow A.

During use, voltage is applied to actuator 10 from a voltage source 60 such as a battery, a standard power plug, a capacitor, a photovoltaic cell or any suitable source.

Figure 5A:
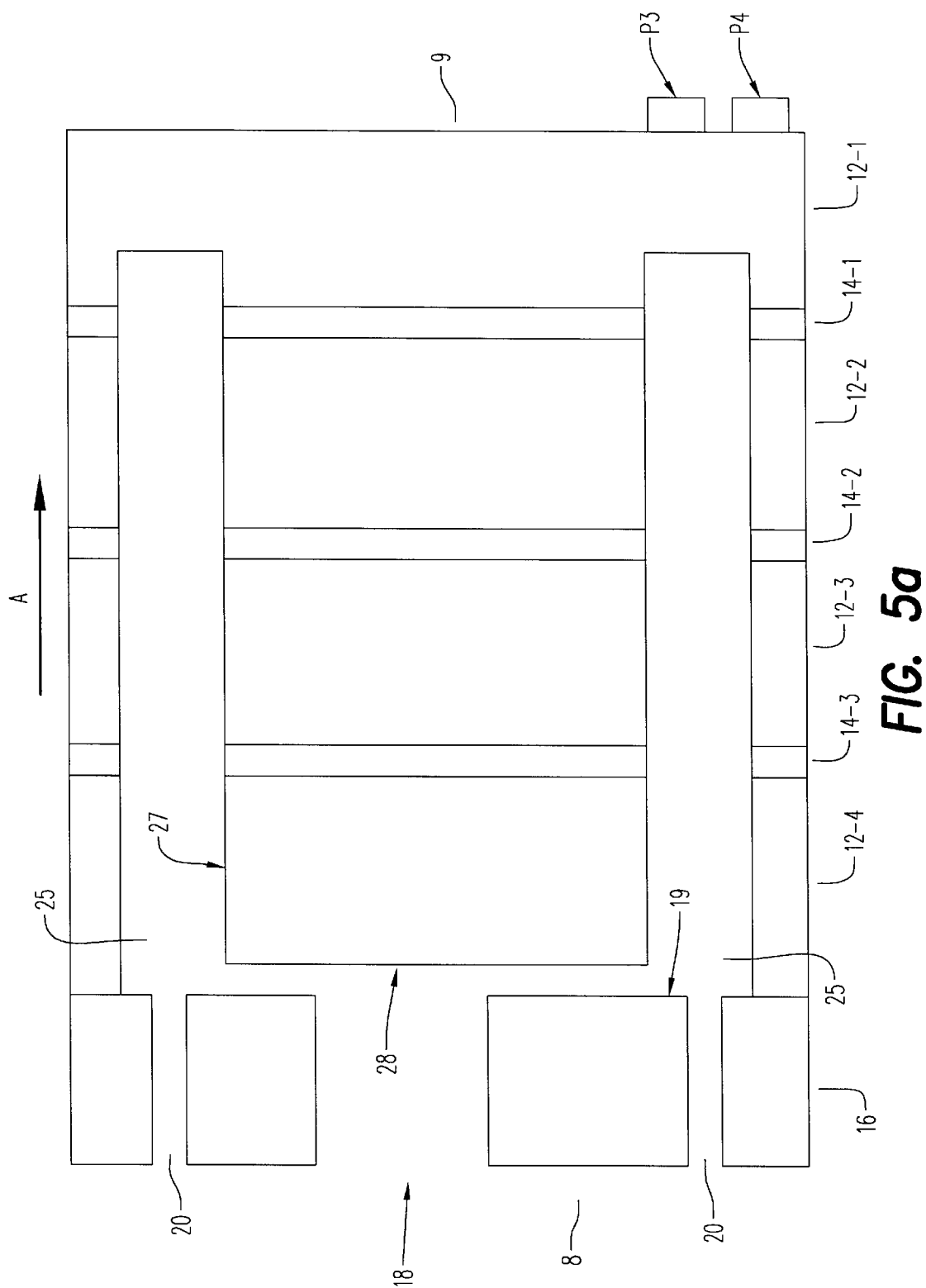
FIG. 5a is a cross sectional view as in FIG. 3 showing the actuator in an open state.
Figure 5B:
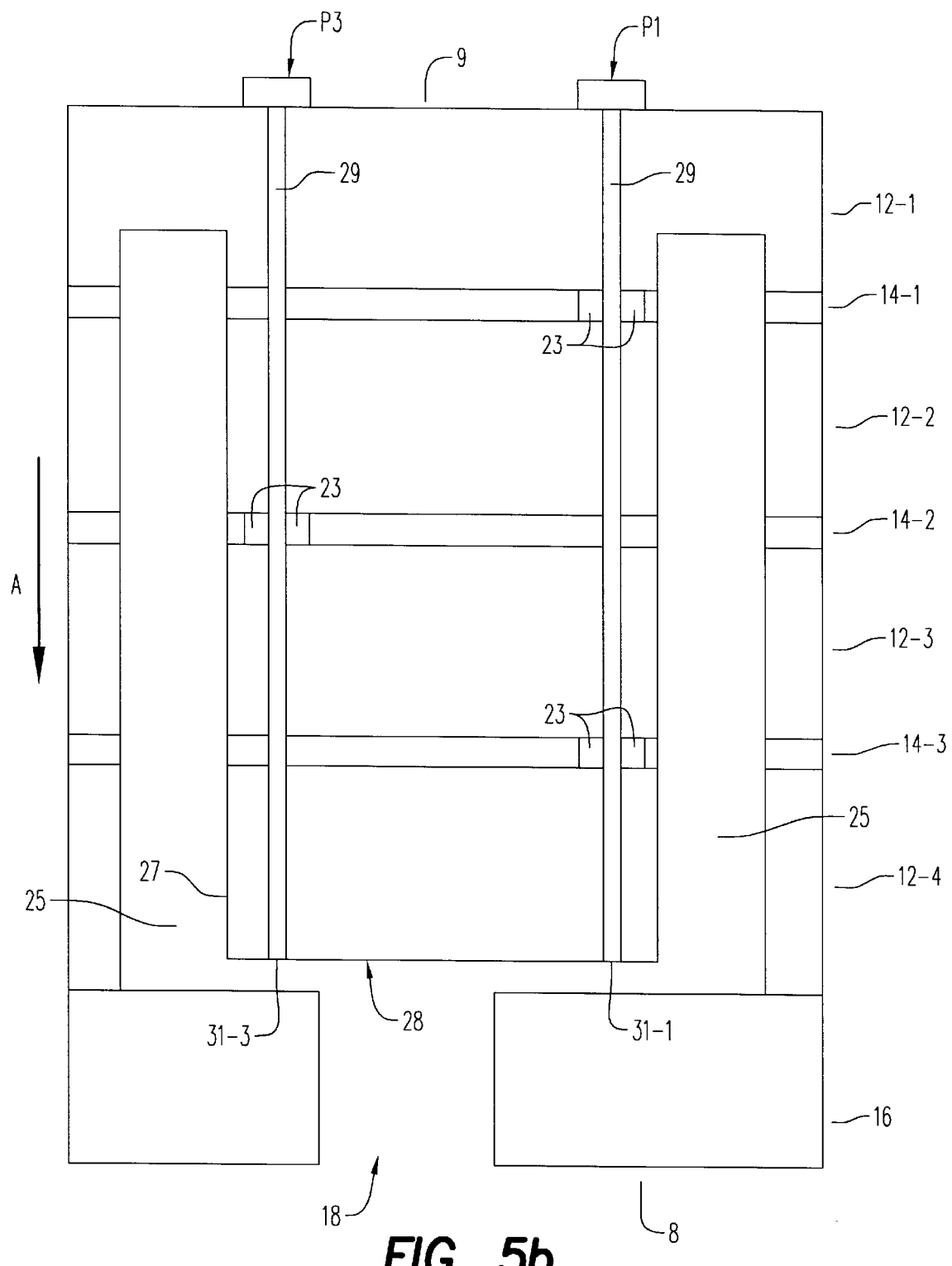
FIG. 5b is a cross sectional view as in FIG. 4a showing the actuator in an open state.

The expansion of actuator 10 and contraction of core 27 moves a flat face 28 disposed on an end of core 27 away from an inside surface 19 of first opening 18. First opening 18 is shown in a closed state in FIGS. 3, 4a and 4b with actuator 10 contracted and core 27 expanded to seal face 28 to surface 19. First opening 18 is shown in an open state in FIGS. 5a and 5b with actuator 10 expanded and core 27 contracted to unseal face 28 from surface 19.

Actuator 10 in the open condition places second opening 20 in fluid communication with first opening 18. Actuator 10 in the closed condition seals second opening 20 from first opening 18.

Because of the matching of materials of core 27, actuator 10 and, optionally, opening layer 16, the relative position of surface 19 and face 28 is not significantly affected by changes in temperature. For example, changes in temperature are not sufficient to affect the contact seal between surface 19 and face 28. This allows for very precise control of the relative position of faces 19 and 28 in both the open and closed states.

Figure 6:
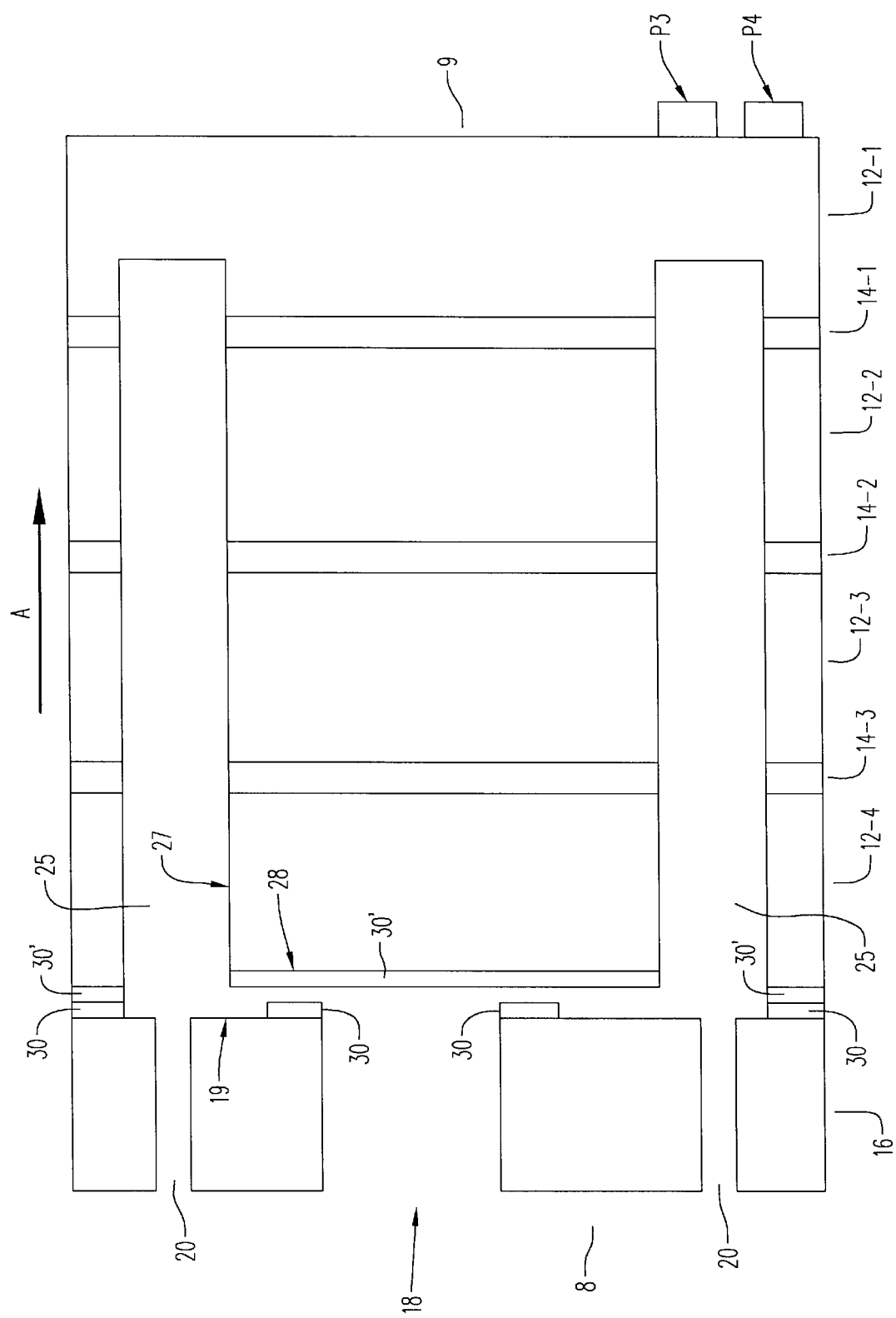
FIG. 6 is a second embodiment of the actuator of FIG. 1.

To ensure a complete seal, surface 19 and face 28 are smooth and flat. In an alternate embodiment both faces 19 and 28 are polished. In yet another alternate embodiment, shown in FIG. 6, surface 19 has an annular insert 30 and face 28 has a matching annular insert 30' disposed thereon.

Inserts 30, 30' are made of materials which are non-compressible and which have thermal expansion properties similar to layers 12. One suitable material for inserts 30, 30' is silicon. Preferably, insert 30 is an annular rim disposed about opening 18. Annular rim 30 has a width of about 200 um.

Actuator 10 is adapted to receive fluid through first opening 18 and is adapted to selectively open or close to place first opening 18 in fluid communication with second opening 20. Conversely, actuator 10 is adapted to receive fluid through second opening 20 and is adapted to selectively open or close to place second opening 20 in fluid communication with first opening 18. Thus, actuator 10 may be used bi-directionally.

The movement provided by each layer 12 is proportional to the voltage applied to electrode layers 14. Thus, for layers 12 having the same overall size and displacement, the voltage required is inversely related to number of layers 12. For example, an actuator 10 having 100 layers 12, 100 electrode layers 14 and a total overall thickness of 5 mm will displace about 5 um when 50 volts are applied.

In the preferred embodiment, the actuator 10 is cube-shaped and has dimensions equal to about 5 mm by 5 mm by 5 mm. Actuator 10 has a typical actuation voltage of about 50 volts and exhibits a maximum displacement of about 20 um. In this embodiment, each layer 12 of actuator 10 is about 200 um thick, each electrode layer 14 is 0.1 um thick, and opening layer 16 is about 500 um thick. Thus, actuator 10 in this embodiment would include about twenty-five layers 12 and twenty-four electrode layers 14.

Figure 7B:
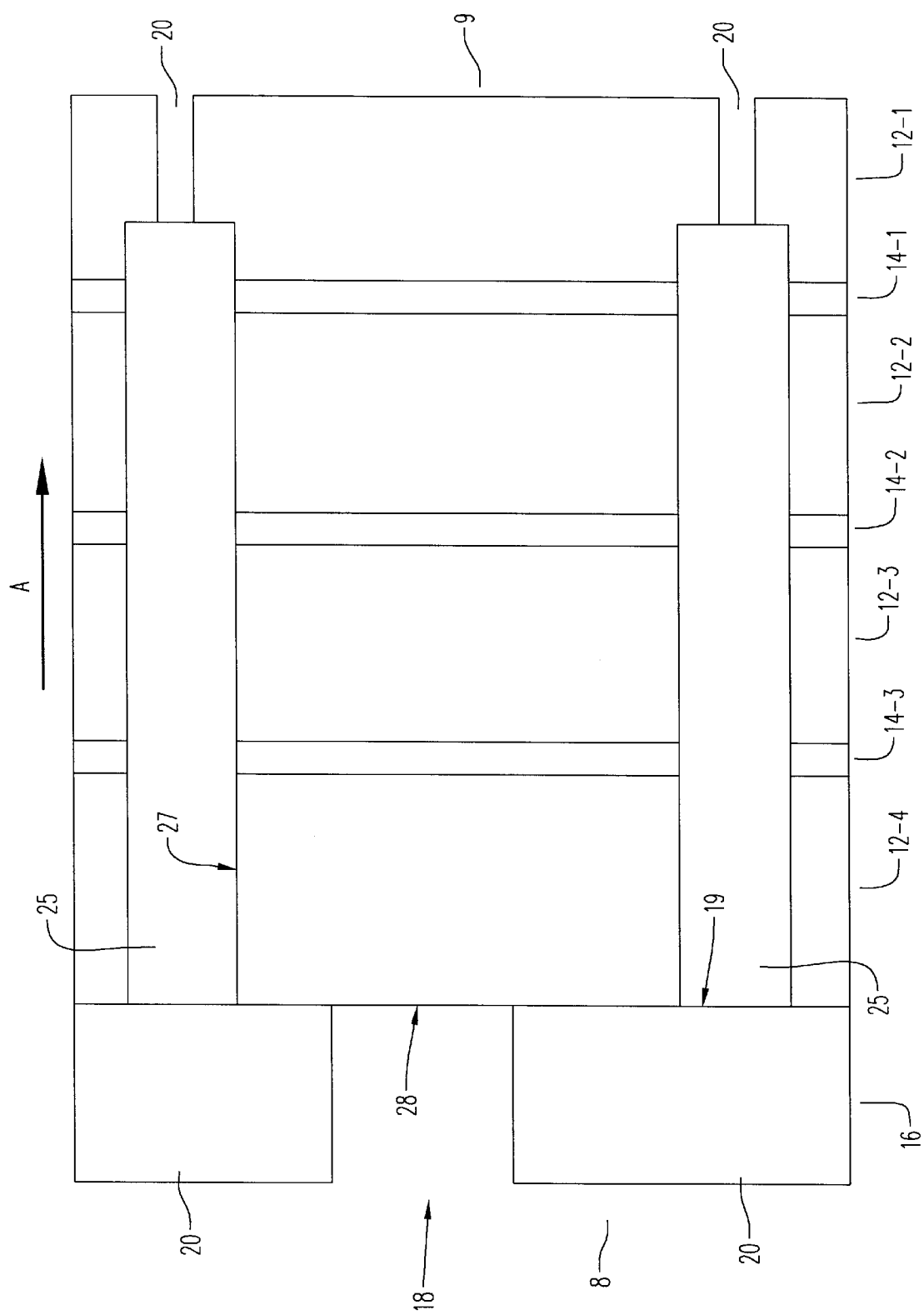

In an alternate embodiment, opening layer 16 does not include second opening 20, rather the top 9 of actuator 10 has the second opening 20 defined therein, wherein second opening 20 is in fluid communication with cavity 25 as shown in FIGS. 7a and 7b.

The flow of fluid through actuator 10 may be regulated between the open and closed states by varying the voltage applied to electrode layers 14 to partially open actuator 10. Thus, in the example described above, where 50 volts provides about 5 um of actuation distance, the application of 40 volts results in an actuation distance of about 4 um.

Figure 8:
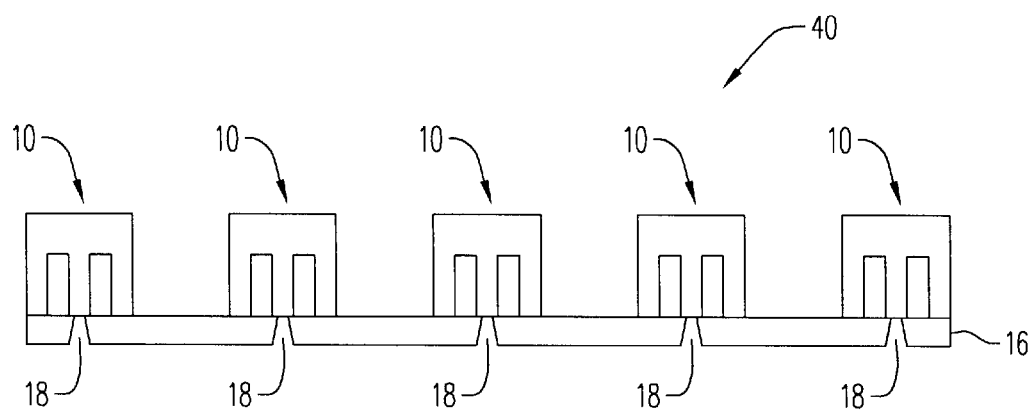
FIG. 8 is a cross sectional view of a one dimensional array of piezoelectric actuators.
Figure 9:
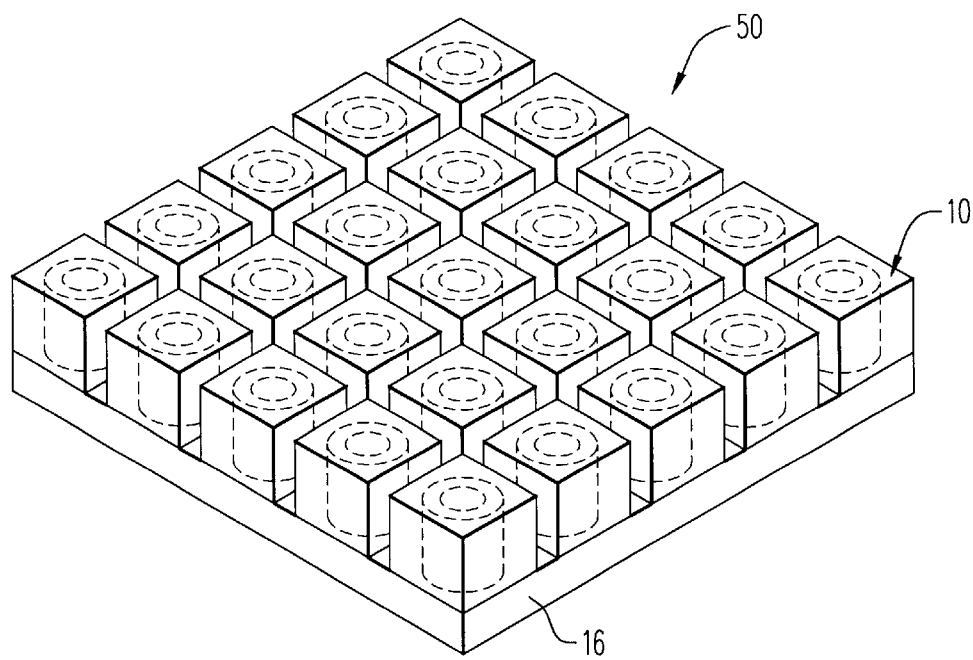
FIG. 9 is a perspective view of a two dimensional array of piezoelectric actuators.

Actuator 10 is further adapted to be assembled as a one dimensional array 40 of actuators 10, shown in FIG. 8. Actuator 10 is further adapted to be assembled as a two dimensional array 50 of actuators 10, shown in FIG. 9. Arrays 40, 50 are shown as regular arrays for convenience only. The present invention is intended to encompass irregular one and two dimensional arrays.

Array 40, 50 is adapted to receive fluid through first opening 18 from a common source and is adapted to selectively open or close to place first openings 18 of all actuators 10 in fluid communication with second openings 20, thus outputting the fluid to a common conduit. It should be recognized that array 40, 50 may also be adapted to receive fluid through second openings 20 from a common source and be adapted to selectively open or close to place second openings 20 of all actuators 10 in fluid communication with openings 18, thus outputting the fluid to a common conduit.

Alternately, array 40, 50 is adapted to receive fluid through first openings 18 from a common source and is adapted to selectively open or close to place first openings 18 of at least some of actuators 10 in fluid communication with second openings 20, thus outputting the fluid to a first common conduit. Array 40, 50 can be further adapted to selectively open or close to place openings 18 of others of actuators 10 in fluid communication with second openings 20, thus outputting the fluid to a second common conduit. Thus, array 40, 50 may be used as a three-way valve.

It should be recognized that array 40, 50 may also be adapted to selectively open or close to place second openings 20 of at least some of actuators 10 in fluid communication with openings 18, thus outputting the fluid to a first common conduit. Array 40, 50 can be further adapted to selectively open or close to place second openings 20 of others of actuators 10 in fluid communication with first openings 18, thus outputting the fluid to a second common conduit.

The flow of liquid through array 40 can be regulated by varying the voltage applied to electrodes 14, as described above. Additionally, the flow is optionally regulated by providing voltage to the electrodes 14 of only those actuators 10 of array 40, 50 necessary to provide the desired flow. Moreover, both methods may be combined such that some actuators 10 of array 40, 50 may be fully open, some may be closed, and others may be partially open.

In the preferred embodiment, layers 12 are made by mixing ceramic powder with organic solvents and water to provide a semi-solid slurry. The slurry is cast onto a backing material in the desired thickness. Ceramics in this form are in the "green" or "unfired" state. The ceramic cast is cut into the shape desired for each layer 12 of actuator 10. As described above, electrode layers 14 are disposed upon layers 12 while in the green state.

The backing material is peeled away from the layer 12 and they are stacked one upon the other to provide the desired height of actuator 10. The stack of layers 12 are subjected to a heat/compression cycle. The stack is compressed to about 2000 psi and heated to 80 C. This cycle acts to remove all air pockets from between layers 12 and 14 of actuator 10.

The electrically conductive pads P1, P2, P3, P4 are disposed on layer 12-1 and holes 31 are filled with electrical conductor 29. A vacuum may be applied to aid in drawing electrical conductor 29 into holes 31.

The actuator 10 is then cured within a kiln or furnace. Standard heating curves, known in the art, are used to cure actuator 10. In one such heating curve, the temperature within the kiln is increased to about 400 C. The temperature remains at about 400 C. for about one hour. This first hold period permits the organic solvents and water within the layers 12, 14 to slowly evaporate from actuator 10. At the end of the one hour period, the temperature is increased to about 900 C. and allowed to slowly cool to room temperature. At the end of this cycle actuator 10 a cured structure.

In order to provide actuator 10 with the expansion and contraction properties described above, the actuator must be polarized via a poling process. Actuator 10 is heated to about 500 C. and a voltage of about 400 volts is applied to the electrodes. The voltage is applied to actuator 10 during the entire heating and cooling process. The poling process aligns the crystalline structure within actuator 10 to enable expansion and contraction. During the poling process, either pads P1 and P3 are electrically connected together or pads P2 and P4 are electrically connected together. The voltage applied to P1/P3 or P2/P4 causes the crystalline structure of the ceramic materials within layers 12 of actuator 10 to align, thus enabling the expansion and contraction described above.

After the poling process, cavity 25 is formed within actuator 10 by means of machining, ultrasonic milling, laser cutting or other suitable means as described above. Additionally, portions of cavity 25 can be partially punched into the green ceramic and the remaining material removed by machining, ultrasonic milling, laser cutting or other suitable means as described above. In the event that portions of cavity 25 and core 27 are punched within actuator 10 prior to the poling process, pads P1/P3 and pads P2/P4 must be electrically connected together during the poling process.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An actuator assembly, comprising
   a first and a second stack of piezoelectric materials having electrode layers connecting said stacks to a voltage source;
   a cavity defined within said first stack adapted to receive a first end of said second stack
   a first opening and a second opening defined within said first stack and in fluid communication with said cavity wherein said first opening has a flat surface within said cavity;
   a flat face opposite said first end for forming a contact seal with said flat surface; and
   said first and second stacks are adapted to unseal said flat face from said flat surface in response to a voltage from said voltage source.

2. The actuator assembly of claim 1 wherein said first opening is formed within an opening layer.

3. The actuator assembly of claim 2 wherein said second opening is formed within said opening layer.

4. The actuator assembly of claim 2 wherein said opening layer has thermal properties similar to said stacks.

5. The actuator assembly of claim 4 wherein said opening layer comprises silicon.

6. The actuator assembly of claim 1 wherein said first and second stacks are comprised of ceramic material.

7. The actuator assembly of claim 1 wherein said first stack expands and said second stack contracts in response to said voltage.

8. The actuator assembly of claim 1 wherein the position of said face and said surface with respect to one another is not significantly affected by changes in temperature.

9. The actuator assembly of claim 1 wherein said face is adapted to move about 5 um.

10. The actuator assembly of claim 1 wherein said first opening is adapted to receive fluid from a source.

11. The actuator assembly of claim 10 wherein said second opening is adapted to provide fluid to a conduit.

12. The actuator assembly of claim 1 wherein said face and said surface are polished.

13. The actuator assembly of claim 1 wherein said face further includes a first insert disposed thereon, said surface further includes a second insert disposed thereon, and said first and second inserts have thermal properties similar to said stacks.

14. The actuator assembly of claim 13 wherein said inserts are comprised of silicon.

15. An array of actuator assemblies, comprising:
    at least one row having a plurality of actuator assemblies wherein each actuator assembly comprises:
       a first and a second stack of piezoelectric materials having electrode layers connecting said stacks to a voltage source;
       a cavity defined within said first stack adapted to receive a first end of said second stack
       a first opening and a second opening defined within said first stack and in fluid communication with said cavity wherein said first opening has a flat surface within said cavity;
       a flat face opposite said first end for forming a contact seal with said flat surface; and
       said first and second stacks are adapted to unseal said flat face from said flat surface in response to a voltage from said voltage source.

16. The array of claim 15 comprising more than one row.

17. The array of claim 15 wherein each of said first openings is formed within a common opening layer.

18. The array of claim 17 wherein each of said second openings is formed within said opening layer.

19. The array of claim 18 wherein said opening layer has thermal properties similar to said stacks.

20. The array of claim 19 wherein said opening layer comprises silicon.

21. The array of claim 15 wherein each of said first and second stacks are comprised of ceramic material.

22. The array of claim 15 wherein each of first stacks expand and each of said second stacks contract in response to said voltage.

23. The array of claim 15 wherein the position of each of said faces and said surface with respect to each other is not significantly affected by changes in temperature.

24. The array of claim 15 wherein each of said faces are adapted to move about 5 um.

25. The array of claim 15 wherein each of said first openings are adapted to receive fluid from a source.

26. The array of claim 25 wherein each of said second openings are adapted to provide fluid to a conduit.

27. The array of claim 25 wherein at least one of said second openings is adapted to provide fluid to a first conduit and at least one of said second openings is adapted to provide fluid to a second conduit.

* * * * *